(12) United States Patent
Byun

(10) Patent No.: US 10,293,602 B2
(45) Date of Patent: May 21, 2019

(54) INK JETTING APPARATUS FOR FORMING MICRO-FINE LIQUID DROPLETS AND PRINTING SYSTEM INCLUDING THE SAME

(71) Applicant: Enjet Co. Ltd., Suwon-si, Gyeonggi-do (KR)

(72) Inventor: Do Young Byun, Seoul (KR)

(73) Assignee: Enjet Co., Ltd., Suwon-si (KR)

( * ) Notice: Subject to any disclaimer, the term of this patent is extended or adjusted under 35 U.S.C. 154(b) by 0 days.

(21) Appl. No.: 15/843,001

(22) Filed: Dec. 15, 2017

(65) Prior Publication Data
US 2018/0304621 A1 Oct. 25, 2018

(30) Foreign Application Priority Data
Apr. 20, 2017 (KR) .................. 10-2017-0050791

(51) Int. Cl.
*B41J 2/04* (2006.01)
*B41J 2/045* (2006.01)
*B41J 2/175* (2006.01)
*B41J 2/14* (2006.01)
*B41J 2/07* (2006.01)

(52) U.S. Cl.
CPC ............ *B41J 2/04511* (2013.01); *B41J 2/04* (2013.01); *B41J 2/072* (2013.01); *B41J 2/1408* (2013.01); *B41J 2/14104* (2013.01); *B41J 2/14201* (2013.01); *B41J 2/175* (2013.01); *B41J 2202/02* (2013.01); *H05K 2203/013* (2013.01)

(58) Field of Classification Search
CPC ...... B41J 2/04511; B41J 2/072; B41J 2/1408; B41J 2/14104; B41J 2/14201; B41J 2/175; B41J 2/14145; B41J 2/14032
See application file for complete search history.

(56) References Cited

U.S. PATENT DOCUMENTS

| 4,672,397 | A | * | 6/1987 | Suga | B41J 2/1429 347/21 |
|---|---|---|---|---|---|
| 4,752,787 | A | * | 6/1988 | Matsumoto | B41J 2/1404 347/65 |
| 7,997,689 | B2 | * | 8/2011 | Peng | B41J 2/04 347/65 |
| 2006/0187277 | A1 | | 8/2006 | Dean, Jr. et al. | |
| 2010/0103227 | A1 | * | 4/2010 | Desse | B41J 2/14 347/74 |

FOREIGN PATENT DOCUMENTS

JP        2012006308 A    1/2012
KR    10-2014-0059013    5/2014

* cited by examiner

*Primary Examiner* — Juanita D Jackson
(74) *Attorney, Agent, or Firm* — Berggren LLP

(57) ABSTRACT

The present disclosure relates to an ink jetting apparatus and a printing system including the same, the ink jetting apparatus including a liquid droplet generating unit configured to generate liquid droplets and jet the generated liquid droplets, a guide channel unit having a channel to guide the jetted liquid droplets and control evaporation of the liquid droplets, and being configured to protect the liquid droplets from thermal and physical disturbance; and a nozzle unit configured to discharge the liquid droplets that passed through the guide channel unit towards a substrate.

16 Claims, 8 Drawing Sheets

INK JETTING APPARATUS FOR FORMING MICRO-FINE LIQUID DROPLETS AND PRINTING SYSTEM INCLUDING THE SAME

PRIORITY

This application claims priority of Korean application 10-2017-0050791 filed on Apr. 20, 2017 and the contents of which is incorporated herein by reference.

BACKGROUND

Field

The present disclosure relates to an ink jetting apparatus and a printing system including the same, more particularly, to an ink jetting apparatus capable of forming a pattern of a micro-fine line width by discharging liquid droplets in drop-on-demand method and controlling evaporation of the liquid droplets, thus forming liquid droplets that are smaller than the liquid droplets, and a printing system including the same.

Description of Related Art

Most ink jetting apparatuses configured to jet fluid in the form of liquid droplets used to be applied to inkjet printers in the past, but recently, they are being widely applied and used in high-tech industries such as in processes for manufacturing displays, processes for manufacturing printed circuit boards, processes for manufacturing DNA chips and the like.

Ink jetting apparatuses for discharging liquid droplets such as the conventional piezoelectric method, electrohydrodynamic (EHD) method ink jetting apparatuses and the like have been widely used. The piezoelectric method ink jetting apparatuses use a method where pressurization by a piezoelectric element pushes and discharges the ink accommodated in a chamber, whereas in the electrohydrodynamic (EHD) method, ink is discharged by the electrostatic force caused by a potential difference generated between electrodes.

However, technology of discharging liquid droplets of the drop-on-demand method using the aforementioned methods and then patterning the discharged liquid droplets has limitations in the line widths to be patterned.

In the case of the piezoelectric method, when liquid droplets of picoliter volume are generated, hit on a substrate and then patterned, a minimum line width of around about 20 micrometers may be realized, and in the case of the electrohydrodynamic (EHD) method, fine liquid droplets of femtoliter volume may be generated, but there is a limitation of difficulty in realizing with stability a line width that is not more than 2 micrometers.

Especially, since, in the case of the electrohydrodynamic (EHD) method, jetting is performed in the principle of using electric force to pull a meniscus from a nozzle, excessive electric charges will be accumulated on liquid droplets, and therefore leading to various problems of instability during the hitting process.

For example, in the process where liquid droplets are discharged and hit on a substrate, as the liquid evaporates, the size of the liquid droplets may decrease, in which case, if the electric charges accumulated on the liquid droplets exceed the Rayleigh limit, there is a possibility that the liquid droplets will be pulverized into a spray form.

Further, the electric force acting on the meniscus of a nozzle is proportionate to the intensity of the electric field being formed around the nozzle, the intensity of the electric field having a relationship of $E=V/d$. In order to print on a large size substrate, the distance between the nozzle and the substrate must be spaced apart as much as possible so that printing may be performed with stability despite the non-uniform flatness of the substrate. Currently, in the case of the electrohydrodynamic (EHD) method, there is a problem that in order to realize a line width of several micrometers, the distance between the substrate and the nozzle must be maintained at no more than 10 micrometers. If the distance between the nozzle and the substrate is large, in order to form an electric field of the same intensity, voltage must be increased, in which case the electric charges being accumulated on the meniscus will exceed the Rayleigh limit and thus the liquid droplets will be jetted in a spray method, making it impossible to realize a fine line width. Therefore, in conventional methods, in order to realize a fine pattern of the size of several micrometers, printing had to be performed with the nozzle placed very close to the substrate, and thus it has been difficult to perform precise printing on large size substrates having limitations in the flatness.

Further, the size of the liquid droplets being jetted towards the substrate is related to the diameter of the nozzle. Therefore, in order to form liquid droplets in the size of several micrometers, it will be necessary to manufacture the nozzle to have a diameter of several micrometers as well. However, the ink used in electrodes, semiconductors and the like is functional ink that includes nano-particles, and thus a continuous evaporation phenomenon may occur in the process of discharging liquid droplets from the meniscus, and there may be a problem where if the diameter of the nozzle is small, the nozzle is clogged by the particles included in the ink.

SUMMARY

Therefore, a purpose of the present disclosure is to solve the aforementioned problems of prior art, that is to provide an ink jetting apparatus and a printing system including the same, capable of allowing liquid droplets discharged in the piezoelectric method or the electrohydrodynamic (EHD) method, that are conventional drop-and-demand methods, to pass through a guide channel unit, and capable of controlling and using evaporation of the liquid droplets in the process where the liquid droplets pass through the guide channel unit, thereby forming micro-fine liquid droplets and discharging the micro-fine liquid droplets through a nozzle.

Tasks to be solved by the present disclosure are not limited to the aforementioned tasks, and other tasks not mentioned herein should be clearly understandable by a person skilled in the art from the disclosure hereinbelow.

The aforementioned purpose may be achieved by an ink jetting apparatus according to the present disclosure, including a liquid droplet generating unit configured to generate liquid droplets and jet the generated liquid droplets; a guide channel unit having a channel to guide the jetted liquid droplets and control evaporation of the liquid droplets, and being configured to protect the liquid droplets from thermal and physical disturbance; and a nozzle unit configured to discharge the liquid droplets that passed through the guide channel unit towards a substrate.

Here, the liquid droplet generating unit may be formed as an inkjet head configured to discharge the liquid droplets in drop-on-demand method.

Here, the liquid droplet generating unit may be formed as an inkjet head of piezoelectric inkjet method or an inkjet head of electrostatic inkjet method.

Here, the guide channel unit may be made of metal and may be applied with voltage in order to focus the liquid droplets having electric charges to a center of the guide channel unit.

Here, the ink jetting apparatus may further include a gas supply unit configured to supply gas to an inside of a channel of the guide channel unit along a moving direction of the liquid droplets.

Here, Reynolds Number may be 2,300 or below such that flow of the gas in the nozzle unit is laminar flow.

Here, the ink jetting apparatus may further include a heating unit configured to heat an outer circumference of the guide channel unit.

Here, the ink jetting apparatus may further include a heat shield configured to prevent heat generated in the heating unit from being transferred to places other than the guide channel unit.

Here, one end of the guide channel unit where the liquid droplets are discharged and a nozzle tube in the nozzle unit through which the liquid droplets pass may be spaced apart from each other, and the ink jetting apparatus may further include a virtual impactor configured to inhale some of the gas being jetted from the guide channel unit through the spaced apart portion.

Here, a channel of the guide channel unit may be formed such that a tube diameter of the channel decreases in phases along a moving direction of the liquid droplets.

Here, a nozzle tube inside the nozzle unit through which the liquid droplets pass may be formed such that a tube diameter of a channel decreases in phases along a moving direction of the liquid droplets.

Here, the ink jetting apparatus may further include an electric charge quantity control unit formed in the guide channel unit to control an electric charge quantity of the liquid droplets that pass through a channel of the guide channel unit.

Here, the gas may include at least one of a gas kind comprising at least one of air, nitrogen and argon; a gas vaporized from water or from a solvent included the liquid droplets; and a mixed gas of the gas kind and the vaporized gas.

Further, the aforementioned purpose may be achieved by a printing system including the aforementioned ink jetting apparatus; a substrate station configured to mount the substrate to be hit by the liquid droplets being discharged from the ink jetting apparatus; and a transfer unit configured to move the ink jetting apparatus or the substrate station to control a position on the substrate to be hit by the liquid droplets.

Further, the aforementioned purpose may also be achieved by a printing system including the aforementioned plurality of ink jetting apparatuses; a substrate station configured to mount the substrate to be hit by the liquid droplets being discharged from the ink jetting apparatus; and a transfer unit configured to move the ink jetting apparatus or the substrate station to control a position on the substrate to be hit by the liquid droplets.

The ink jetting apparatus and the printing system including the same according to the present disclosure described hereinabove provide an advantage of allowing liquid droplets discharged from the liquid droplet generating unit to pass through the guide channel unit, evaporating the liquid droplets in the process of passing through the guide channel unit so as to form micro-fine liquid droplets, thereby realizing micro-fine line widths of not more than 1 micrometer.

Further, since micro-fine liquid droplets may be generated, there is an advantage that there is no need to form a nozzle having a micro-fine diameter and that the nozzle may be prevented from being clogged.

Further, there is an advantage that stable printing is possible on large size substrates as well.

Further, there is an advantage that amount of electric charges accumulated on the liquid droplets may be controlled, thus preventing the liquid droplets from being jetted in a spray form.

Further, there is an advantage that since the content of solid components included in the liquid droplets may be increased, a thick pattern may be formed.

Further, there is an advantage that environment conditions such as temperature, humidity, concentration of chemical species and the like in the area being patterned may be controlled by the gas being supplied by the gas supply unit.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present between two elements. Like reference numerals refer to like elements throughout.

DETAILED DESCRIPTION

Figure 1:
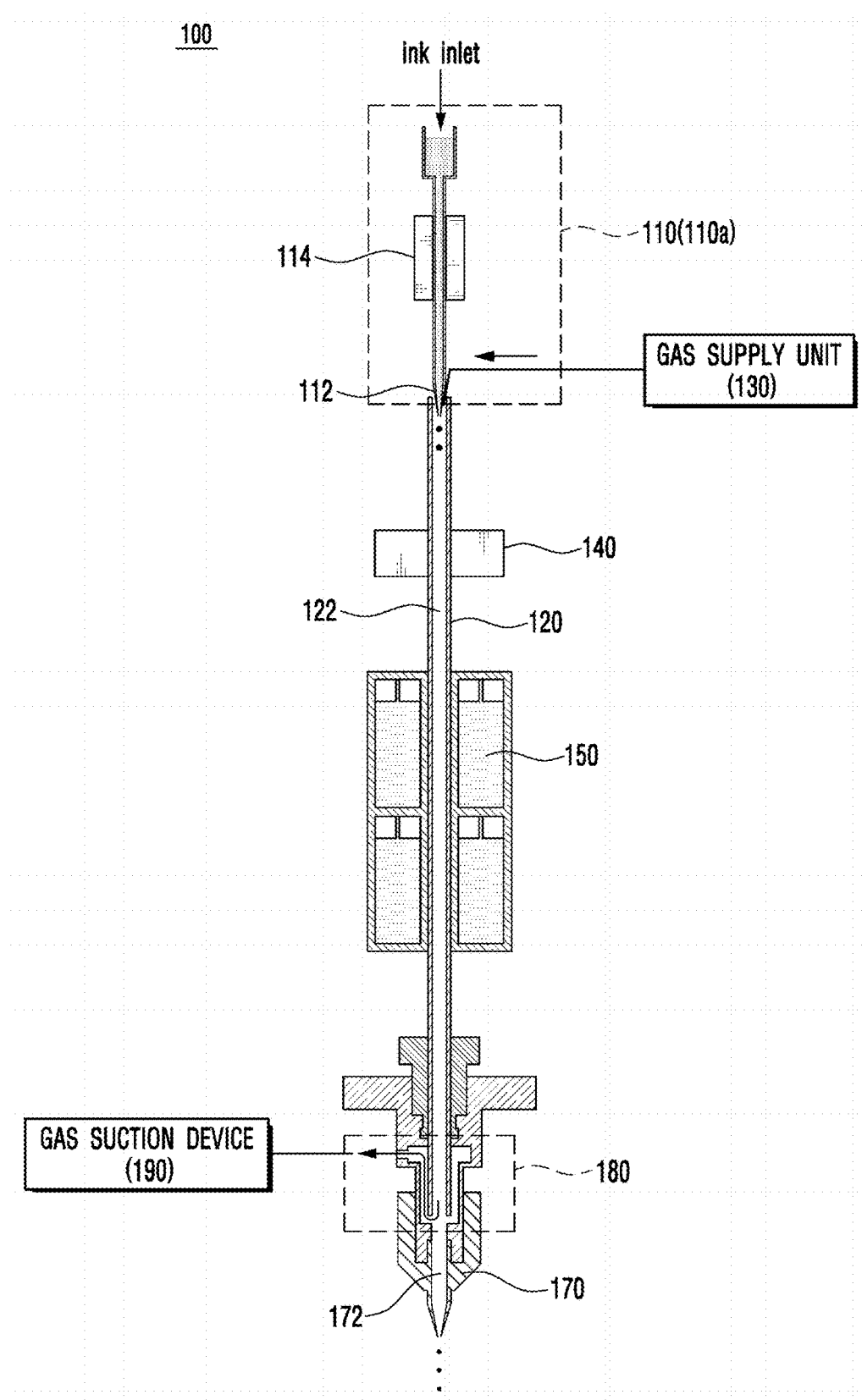
FIG. 1 is a rough view of the general concept of an ink jetting apparatus according to an embodiment of the present disclosure.

Specific matters of the embodiments are included in the detailed description and the drawings.

Advantages and characteristics of the present disclosure, and methods for achieving those advantages and characteristics will become clear with reference to the embodiments described in detail hereinbelow together with the drawings attached. However, the present disclosure is not limited to the embodiments disclosed hereinbelow, but may be realized in various different forms, and thus these embodiments are provided in order to complete the disclosure of the present disclosure and to have a person skilled in the art to completely understand the scope of the present disclosure, and the present disclosure shall only be defined by the scope of the claims. Throughout the entirety of the specification, like reference numerals indicate like component elements.

Hereinbelow, the present disclosure will be described with reference to the drawings provided to describe an ink jetting apparatus and a printing system including the same according to the embodiments of the present disclosure.

Figure 2:
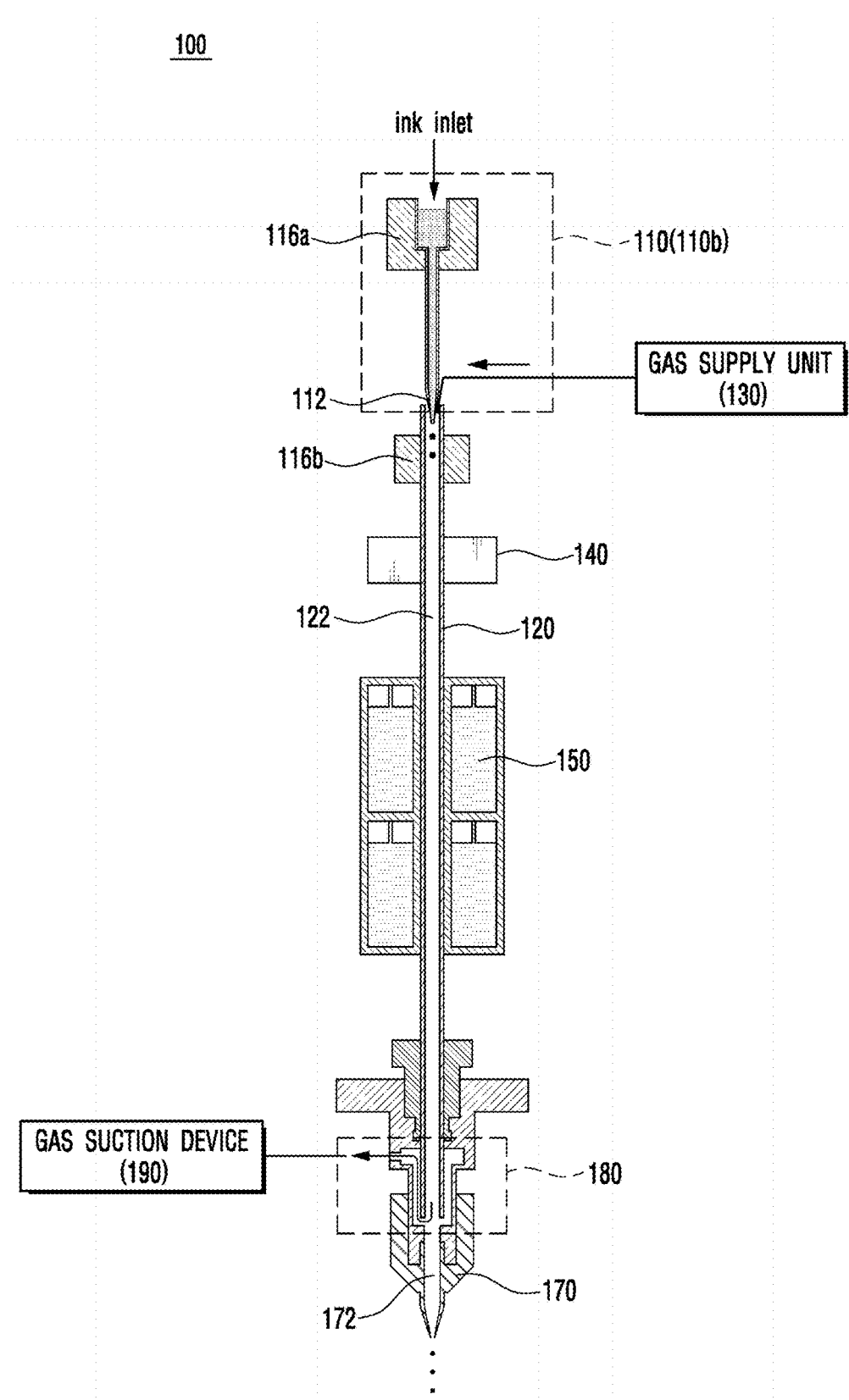
FIG. 2 is a rough view of the general concept of an ink jetting apparatus according to another embodiment of the present disclosure.
Figure 3:
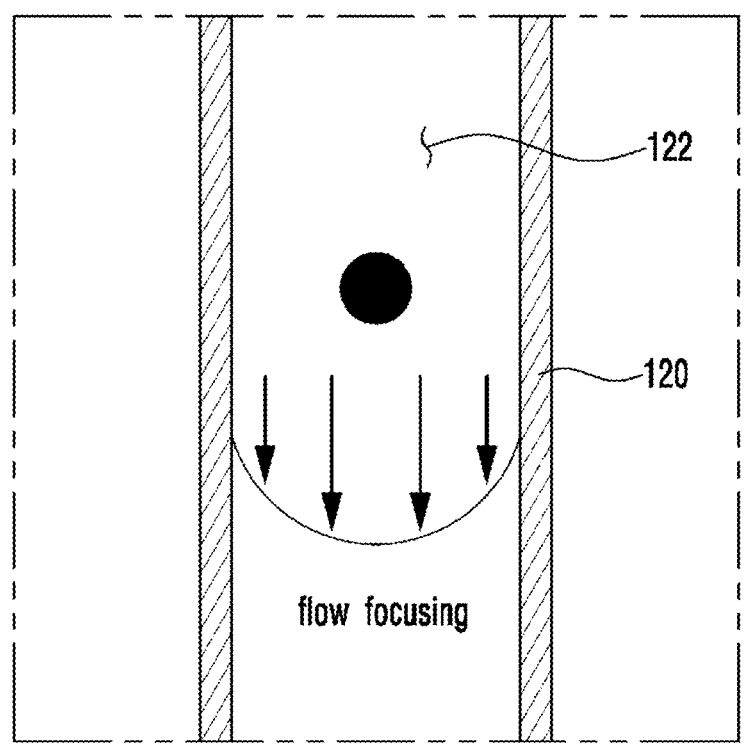
FIG. 3 is a view illustrating a flow of gas inside a guide channel unit.
Figure 4:
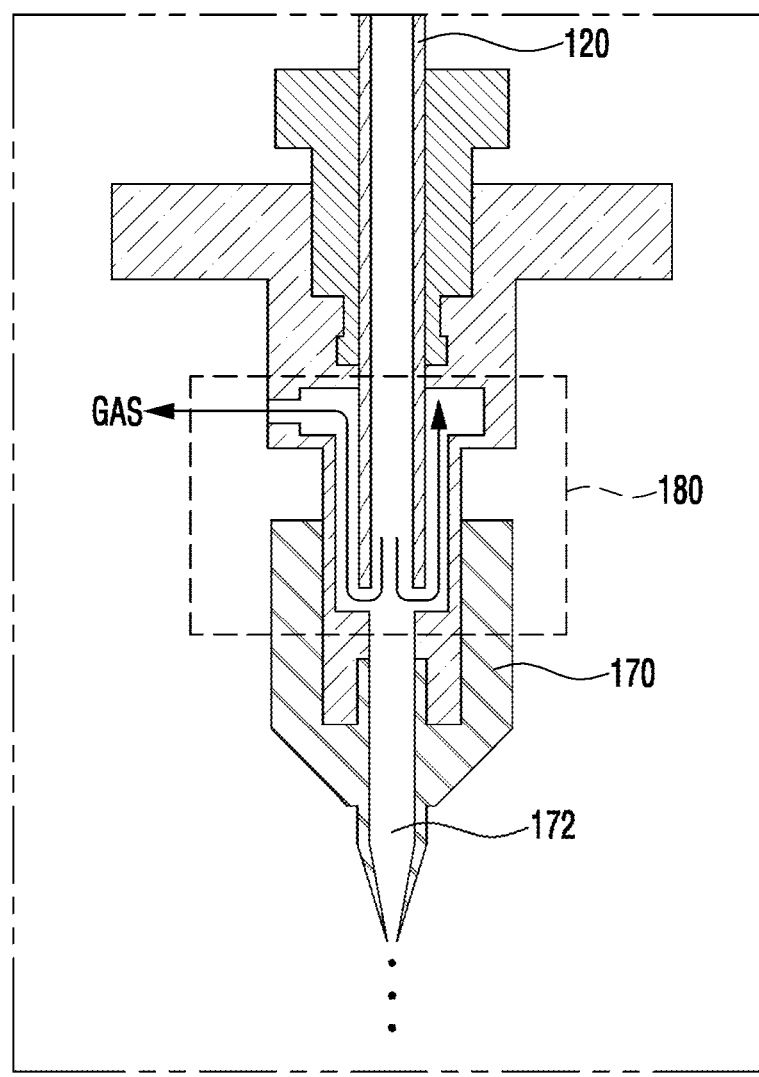
FIG. 4 is an enlarged view of a nozzle unit and a virtual impactor.
Figure 5:
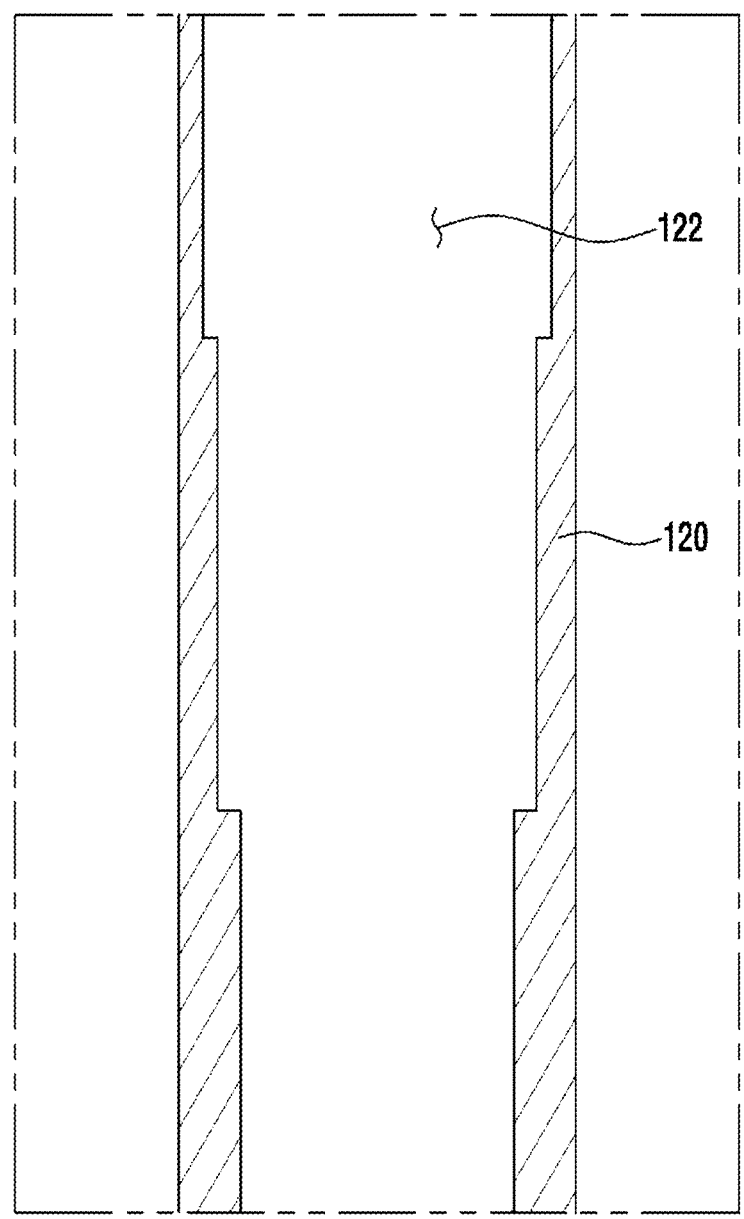
FIG. 5 is a view illustrating an aerodynamic lens formed in a guide channel unit.
Figure 6:
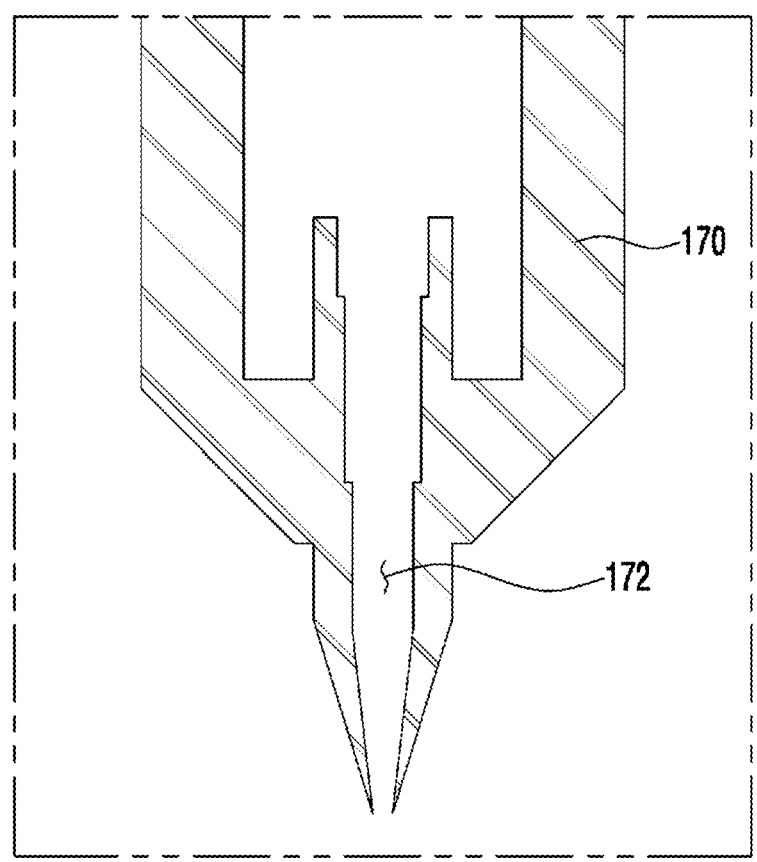
FIG. 6 is a view illustrating an aerodynamic lens formed in a nozzle unit.
Figure 7:
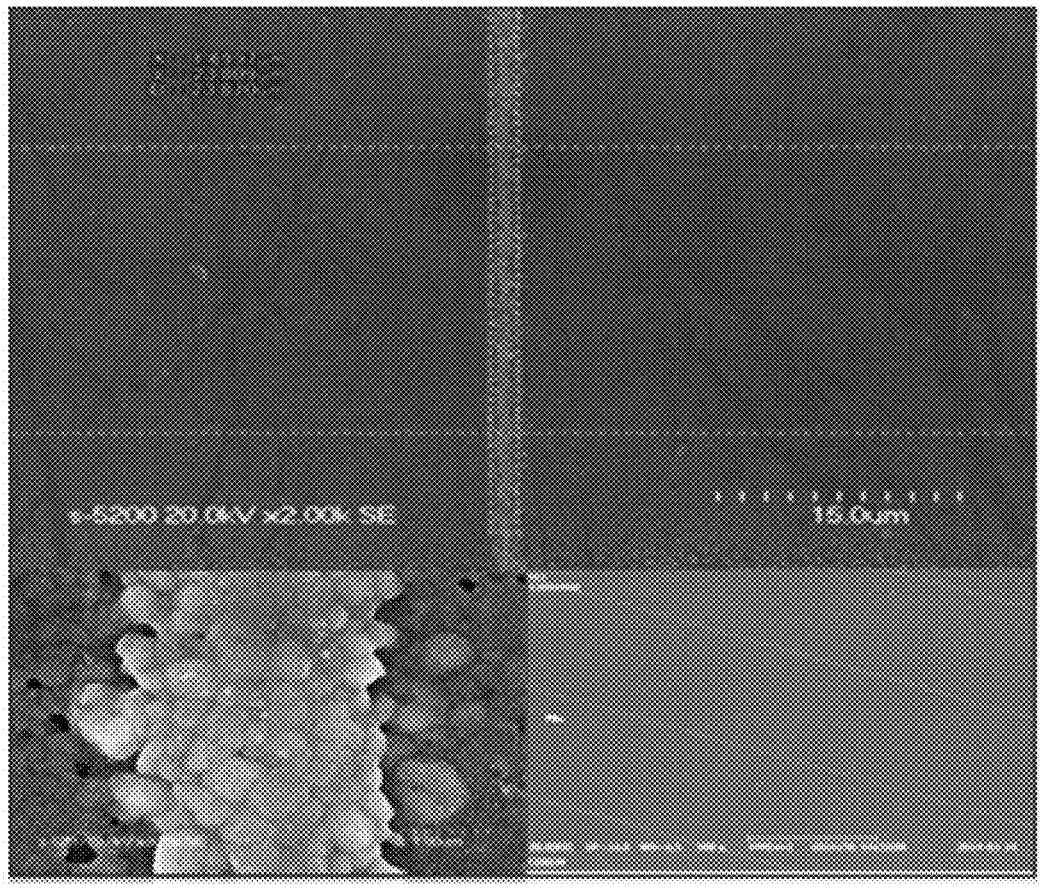
FIG. 7 is an enlarged photograph showing a pattern formed by an ink jetting apparatus according to the present disclosure.

FIG. 1 is a rough view of the general concept of an ink jetting apparatus according to an embodiment of the present disclosure, FIG. 2 is a rough view of the general concept of an ink jetting apparatus according to another embodiment of the present disclosure, FIG. 3 is a view illustrating a flow of gas inside a guide channel unit, FIG. 4 is an enlarged view of a nozzle unit and a virtual impactor, FIG. 5 is a view illustrating an aerodynamic lens formed in a guide channel unit, FIG. 6 is a view illustrating an aerodynamic lens formed in a nozzle unit, and FIG. 7 is an enlarged photograph showing a pattern formed by an ink jetting apparatus according to the present disclosure.

The ink jetting apparatus 100 according to an embodiment of the present disclosure may be configured to include a liquid droplet generating unit 110, a guide channel unit 120 and a nozzle unit 170. Further, the ink jetting apparatus 100 may further include a gas supply unit 130, a heating unit 150, a virtual impactor 180 or an electric charge quantity control unit 140.

The liquid droplet generating unit 110 generates liquid droplets, discharges the generated liquid droplets and supplies the discharged liquid droplets to the guide channel unit 120.

A liquid droplet generating unit 110a may be formed as an inkjet head of the conventional piezoelectric inkjet method, heat foam inkjet method, or electrostatic inkjet method, but there is no limitation thereto, and thus any combination thereof or any other well-known inkjet method may be used as long as liquid droplets may be discharged in the drop-on-demand method.

For example, in the case of the piezoelectric inkjet method as illustrated in FIG. 1, it is possible to pressurize the ink supplied from outside using a piezoelectric element 114 to discharge the ink as liquid droplets through a nozzle 112. Configuration of an inkjet head 110a of the piezoelectric inkjet method is a well-known technology, and thus more detailed description thereof will be omitted.

Further, a liquid droplet generating unit 110b may be formed as an inkjet head 110b of the conventional electrostatic inkjet method as illustrated in FIG. 2, that is, the ink supplied from outside may be discharged as liquid droplets through the nozzle 112 by the electrostatic force caused by a potential difference between an electrode 116a formed nearby the nozzle 112 and an electrode 116b located on a lower portion of the nozzle 112. Configuration of the inkjet head 110b of the electrostatic inkjet method is also a well-known technology, and thus more detailed description thereof will be omitted.

Although not illustrated herein, in order to guarantee the conditions for generating liquid droplets of a uniform size of a desired frequency in the drop-on-demand method, a sensor for monitoring the temperature or viscosity of the ink may be attached inside the liquid droplet generating unit 110.

For reference, the features besides those of the liquid droplet generating unit 110a, 110b are the same between FIGS. 1 and 2.

The guide channel unit 120 has a long channel 122 formed in a perpendicular direction so that it may be supplied with the liquid droplets discharged from the nozzle 112 of the liquid droplet generating unit 110 located on a higher position, and controls evaporation of a solvent of the main component materials of the liquid droplets in the process of flowing inside the channel 122, thereby forming the liquid droplets in smaller sizes, and then allows the liquid droplets to be supplied to the nozzle unit 170 located on a lower portion. The channel 122 of the guide channel unit 120 must have a length that can evaporate the solvent of at least 1% or more under the temperature and humidity conditions being controlled. Here, the guide channel unit 120 may protect the liquid droplets from thermal, physical external disturbance and control evaporation of the liquid droplets while the liquid droplets flow inside the channel 122.

The guide channel unit 120 may be made of polymer resin such as acryl, a transparent material such as glass, or a metal material such as copper, stainless, steel and the like having good heat conductivity. When the guide channel unit 120 is made of the metal material, voltage may be applied to the guide channel unit 120 such that the liquid droplets are focused to a center of the guide channel unit 120 and be discharged.

Although not illustrated, the aforementioned liquid droplet generating unit 110 may be installed inside the guide channel unit 120 and generate liquid droplets. Here, the guide channel unit 120 may be prepared not in the form of a long channel having a single diameter but in the form of a channel of which the diameter varies so as to accommodate the liquid droplet generating unit 110 therein.

The gas supply unit 130 may supply gas inside the channel 122 in the direction from an upper portion to a lower portion of the guide channel unit 120. The gas supplied by the gas supply unit 130 serves as a carrier that moves the liquid droplets inside the channel 122 and prevents the liquid droplets from adhering to the inside of the channel 122 and clogging the channel 122.

Further, as illustrated in FIG. 3, the velocity distribution of the gas inside the channel 122 has a parabolic distribution where, at the center of the channel 122, the gas has a high velocity, but at the edge of the channel 122, the gas has a relatively low velocity. Such a velocity distribution may guide the liquid droplets flowing inside the channel 122 to flow along the center of the channel 122 (flow focusing). Here, when applying voltage to the guide channel unit 120 to focus the liquid droplets having electric charges to the center and discharge the liquid droplets as aforementioned, gas may not be supplied.

Further, the gas supply unit 130 may control the environment such as the temperature, humidity, chemical species concentration and the like in the area of the substrate to be patterned by supplying the appropriate gas to the inside of the channel 122.

Here, the gas being supplied by the gas supply unit 130 may be a gas kind such as air, nitrogen, argon and the like, but there is no limitation thereto. Otherwise, water vapor gas that is vaporized from water may be supplied, and may then be mixed with the gas kind to control the humidity. Otherwise, the gas may be gas vaporized from the solvent (for example, ethanol) included in the liquid droplets, or gas mixed with the aforementioned gas kind. When supplying the gas vaporized from the solvent, the gas may be cooled and liquefied again when flowing along the guide channel unit 120 and the nozzle unit 170, and therefore, in order to prevent this, it is preferable to allow the temperature of the guide channel unit 120 and the nozzle unit 170 to be controlled.

The electric charge quantity control unit 140 is formed in a predetermined position of the guide channel unit 120 to allow the electric charge quantity of the fine liquid droplets passing through the channel 122 of the guide channel unit 120 to be controlled. As the liquid droplets evaporate in the guide channel unit 120, the electric charges accumulated on the surface of the liquid droplets may increase. Therefore, if the electric charges accumulated on the liquid droplets passing through the channel 122 exceed the Rayleigh limit, the liquid droplets may be pulverized into spray, but in the present disclosure, since the electric charge quantity of the liquid droplets may be controlled by the electric charge quantity control unit 140, the aforementioned problems can be resolved.

As an example of the electric charge quantity control unit 140, various ionizers may be used. For example, a rayonnant ionizer that uses soft x-rays may be arranged in the predetermined position of the guide channel unit 120 to control the electric charges of the liquid droplets passing through the guide channel unit 120. Soft x-rays are one kind of radiation. Depending on the material permeability, x-rays with low permeability, that are easily absorbed even by thin air layers, are called soft x-rays, whereas x-rays with high permeability, used in Roentgen rays and the like, are called hard x-rays. X-rays are generated when electrons are accelerated to collide with a metal target, and thus the rayonnant ionizer is formed by an x-ray tube consisting of a filament that generates electrons and a metal target with which electrons may collide with, and a high voltage apparatus that accelerates the electrons to high velocity. By positioning this ionizer to emit x-rays to the liquid droplets from the side surface of the guide channel unit 120, it is possible to control the electric charge quantity of the liquid droplets.

Otherwise, by positioning a uranium material that generates negative ions such as polonium 210 in the guide channel unit 120 as the electric charge quantity control unit 140, it is possible to control the electric charges of the liquid droplets.

Otherwise, the electric charge quantity control unit 140 may be arranged outside together with the gas supply unit 130 to supply electrically charged gas to the guide channel unit 120 through the gas supply unit 130. Therefore, by controlling the electric charges on the surface of the liquid droplets by the electrically charged gas, it is possible to resolve the aforementioned problem. For example, in order to supply the electrically charged gas, a voltage application type (corona discharge) ionizer may be used. That is, it is possible to apply high voltage to a discharge needle to form ions of gas, and supply these ions of gas to the gas channel unit 120 through the gas supply unit 130, thereby neutralizing the electric charges of the liquid droplets. Here, the electric charges generated in the ionizer may have a polarity that is opposite to the electric charges of the liquid droplets or bipolarity.

In another method, it is possible to place the voltage application type ionizer inside the channel 122 of the guide channel unit 120 in the form of a probe needle to ionize inside of the channel 122 of the guide channel unit 120 the gas being supplied from the gas supply unit 130 to control the electric charges of the liquid droplets.

The heating unit 150 heats the outer circumference of the guide channel unit 120 to heat the gas inside the guide channel unit 120, thereby controlling the temperature, or emits radiant heat through an entirety or a portion of the guide channel unit 120, that is transparent, to directly heat the liquid droplets flowing along the guide channel unit 120, thereby controlling the evaporation of the liquid droplets.

Here, the heating unit 150 may be formed using various materials and elements that can convert electric energy into thermal energy. For example, a resistor may be adhered to the outer circumference of the guide channel unit 120 to transfer the thermal energy generated in the resistor to the guide channel unit 120. Otherwise, a thermoelement such as a "Peltier" element may be used to transfer the thermal energy of high temperature generated in the thermoelement to the guide channel unit 120. Otherwise, an element that emits radiant energy may be placed near the guide channel unit 120. For example, a heating unit 150 that emits light energy such as a laser, thermal infrared lamp, xenon flash lamp, and hot-wires and the like may be fixated to be spaced apart from the transparent guide channel unit 120 to transfer radiant heat to the inside of the guide channel unit 120. Otherwise, a heating unit 150 such as a piezoelectric actuator and the like that generates microwaves or waves of other wavelength ranges may be installed in the guide channel unit 120 to heat the guide channel unit 120 and transfer heat to the inside of the guide channel unit 120.

Here, in this embodiment, as aforementioned, the heating unit 150 may be formed near the predetermined position of the guide channel unit 120 to heat the guide channel unit 120 by way of energy transfer. Therefore, the heating unit 150 may supply heat to the liquid droplets flowing along the channel 122 of the guide channel unit 120, and this heat may evaporate some components including the liquid droplets and reduce the size of the liquid droplets to micro-fine size. Further, this evaporation may increase the content ratio of solid components in the liquid droplets, thus forming a thick pattern in a single jetting. Further, the heating by the heating unit 150 may evaporate the solvent of the liquid droplets, thereby increasing the viscosity of the liquid droplets, and therefore it is possible to limit the spreading of the liquid droplets in the process where the liquid droplets adhere to the substrate.

Here, since the heat of the heating unit 150 may be diffused outside and heat other structures such as the liquid droplet generating unit 110 or outside air and the like, it is preferable to form a heat shield to surround the heating unit 150 in order to suppress such diffusion.

Natural evaporation may occur while the liquid droplets pass through the long channel 122 of the guide channel unit 120, but the aforementioned effects of evaporation may be maximized by the heating unit 150.

Here, the natural convection flow that the heating by the heater forms must not reverse the flow in the guide channel unit 120 or disturb the stabilized laminar flow. Therefore, it is preferable that the heating unit 150 heats the guide channel unit 120 to not more than 100 degrees Celsius.

The nozzle unit 170 discharges the liquid droplets that passed through the guide channel unit 120 towards the substrate. The velocity at which the liquid droplets are discharged may be determined by the flow velocity of the gas in the nozzle tube 172 obtained from a relationship between the flow rate of the gas being supplied from the gas supply unit 130 and the diameter of the outlet of the nozzle tube 172. The flow velocity of the gas may be limited by the conditions forming the laminar flow. Here, the density of the gas, viscosity of the gas, velocity of the gas, and diameter of the nozzle tube may be determined such that the Reynolds number at the nozzle tube 172 is smaller than 5000, and preferably smaller than 2300.

Only when the liquid droplets are transferred inside the nozzle tube 172 under laminar flow conditions, the liquid droplets can be discharged with stability and precisely hit a targeted point of the substrate when discharged outside through the nozzle tube 172.

For reference, the Reynolds number has the following relation formula.

$$Re = \rho VD/\mu$$

Here, Re is the Reynolds number, p is the density of the gas, V is the velocity of the gas, D is the diameter of the nozzle tube 172, and p is the viscosity of the gas.

Here, the flow rate of the gas may be excessive, causing turbulent flow, and therefore, it is necessary to control the flow velocity of the gas inside the nozzle tube 172. As illustrated in FIG. 4, a lower end of the guide channel unit 120 from which the liquid droplets are discharged and the nozzle tube 172 that is the flow path inside the nozzle unit 170, through which the liquid droplets pass, may be spaced apart from each other and be formed colinearly. Here, through the portion where the lower end of the guide channel unit 120 and the nozzle tube 172 are spaced apart from each other, the gas that passed through the channel 122 of the guide channel unit 120 may be discharged outside. The gas flowing through the central portion of the channel 122 and the liquid droplets that are flow focused to the central portion and transferred may be introduced into the nozzle unit 172, while the remaining gases are discharged outside through the aforementioned spaced apart portion, consequently controlling the flow rate and velocity of the gas being supplied to the inside of the nozzle tube 172. Further, the gas suction device 190 may be connected and formed to inhale the gas through the spaced apart portion.

In the case where the guide channel unit 120 and the nozzle tube 172 of the nozzle unit 170 are formed to be spaced apart from each other, the portion that discharges outside some of the gas supplied to the guide channel unit 120 through the space surrounding the spaced apart portion may form a virtual impactor 180. The flow velocity of the liquid droplets and gas flowing along the center of the channel of the guide channel unit 120 may be controlled by the suction force of the gas suction device 190, and thus the velocity of the gas being introduced into the nozzle tube 172 may be controlled by the suction force of the gas suction device 190, and at the same time, the velocity of the liquid droplets being transferred according to the gas flow and being discharged outside the nozzle unit 170 may be controlled as well.

Here, by inertial motion, the liquid droplets may be moved into the nozzle tube 172 of the nozzle unit 170 that is in the proceeding direction, and a significant amount of gas flowing through the guide channel unit 120 together with the liquid droplets may be discharged outside through the space between the guide channel unit 120 and the nozzle tube 172 by the suction force of the gas suction device 190.

Further, in the present disclosure, as illustrated in FIGS. 5 and 6, inside the channel 122 of the guide channel unit 120 or the nozzle tube 172 of the nozzle unit 170 may be formed such that the diameter of the tube decreases in phases along the motion direction of the liquid droplets, thereby forming an aerodynamic lens.

By forming the diameter of the tube to decrease in phases along the motion direction of the liquid droplets as illustrated, the liquid droplets flowing inside the channel 122 or the nozzle tube 172 may be focused to the center of the channel 122 or the nozzle tube 172.

Hereinbelow, operations of the ink jetting apparatus 100 according to an embodiment of the present disclosure aforementioned with reference to FIGS. 1 to 6. will be described First, examples of the printing material (hereinafter referred to as ink) that may be used in the present disclosure include all kinds of organic and inorganic materials of solid particles, surfactants, polymers and the like dispersed in a solvent. The ink for patterning a conductive material, for example, may be as follows.

By dispersing a conductive nano structure body in a solvent together with a high molecular compound and printing the same, and then performing thermosetting or photosetting thereon, it is possible to secure characteristics of an electrode. The structure of the nano structure body may be nano particles or one-dimensional nano structure body, the one-dimensional nano structure body preferably being at least one of a nano wire, nano rod, nano pipe, nano belt and nano tube structure. Further, the conductive nano structure body is preferably a nano structure body or a carbon nanotube made of one or more selected from a group consisting of gold (Au), silver (Ag), aluminum (Al), nickel (Ni), zinc (Zn), copper (Cu), silicon (Si) and titanium (Ti), or a combination thereof.

The high molecular compound is characterized to be at least one of a natural high molecular compound or a composite high molecular compound, the natural high molecular compound preferably being at least one of chitosan, gelatin, collagen, elastin, hyaluronic acid, cellulose, silk fibroin, phospholipids and fibrinogen, and the composite high molecular compound preferably being at least one of PLGA (Poly(lactic-co-glycolic acid)), PLA (Poly(lactic acid)), PHBV (Poly(3-hydroxybutyrate-hydroxyvalerate), PDO (Polydioxanone), PGA (Polyglycolic acid), PLCL (Poly (lactide-caprolactone)), PCL (Poly(ecaprolactone)), PLLA (Poly-L-lactic acid), PEUU (Poly(ether Urethane Urea)), Cellulose acetate, PEO (Polyethylene oxide), EVOH (Poly (Ethylene Vinyl Alcohol), PVA (Polyvinyl alcohol), PEG (Polyethyleneglycol) and PVP (Polyvinylpyrrolidone).

First, ink is supplied to a predetermined chamber of the liquid droplet generating unit 110, and the ink supplied to the chamber is discharged as fine liquid droplets in the drop-on-demand method through the nozzle 112. Here, the liquid droplet generating unit 110 is preferably formed as one of an inkjet head 110*a* of the piezoelectric inkjet method where liquid droplets are discharged through the nozzle 112 by pressurization by the piezoelectric element 114, and an inkjet head 110*b* of the electrostatic inkjet method where liquid droplets are discharged through the nozzle 112 by the electrostatic force caused by a potential difference between the electrodes 116*a*, 116*b*, but there is no limitation thereto.

The fine liquid droplets being discharged from the nozzle 112 of the liquid droplet generating unit 110 are supplied to the channel 112 of the guide channel unit 120 and move downwards along the channel 122, and while the liquid droplets move along the channel 122, natural evaporation occurs, and therefore the size of the liquid droplets may decrease.

Here, gas may be supplied inside the channel 122 through the gas supply unit 130, and this gas may serve as a carrier that moves the fine liquid droplets, and at the same time, may guide the fine liquid droplets to flow along the center of the channel 122 by flow focusing.

A significant amount of the gas being supplied to the channel 122 of the guide channel unit 120 may be discharged outside by the suction force of the gas suction device 190 through the portion spaced apart between the lower portion of the guide channel unit 120 and the nozzle tube 172 of the nozzle unit 170 forming the virtual impactor 180. Therefore, by the suction force of the gas suction device 190, the flow velocity of the fine liquid droplets being introduced into the nozzle tube 172 may be controlled together with the gas flowing inside the channel 122 of the guide channel unit 120, and therefore, the velocity of the liquid droplets which are discharged through the nozzle unit 170 may be controlled.

Further, in a predetermined position of the guide channel unit 120, the electric charge quantity control unit 140 may be formed to control the electric charge quantity of the fine liquid droplets that flow along the channel 122. Therefore, the electric charge quantity of the fine liquid droplets passing through the channel 122 may be controlled by the electric charge quantity control unit 140, thereby preventing the liquid droplets from being pulverized into spray and then discharged.

Further, in a predetermined position of the guide channel unit 120, the heating unit 150 may be formed to heat the guide channel unit 120, and therefore, by the heating unit 150, heat may be supplied to the fine liquid droplets flowing inside the channel 122. Some of the components including the liquid droplets may be evaporated by the heat being supplied to the fine liquid droplets, and therefore, the size of the fine liquid droplets may be decreased to the size of micro-fine liquid droplets. At the same time, the content ratio of solid components included in the liquid droplets may be increased. Further, since the viscosity of the liquid droplets may be increased by evaporating the solvent of the liquid droplets by the heating of the heating unit 150, spreading of the liquid droplets may be limited in the process of adhering to the substrate.

Further, liquid droplets that are generally discharged in the piezoelectric inkjet method in sizes between 20 and 100 micrometers may be controlled to smaller sizes and patterned. Preferably, nano scale patterning of the liquid droplets to sizes of not more than 1 micrometer is possible.

Further, fine liquid droplets being discharged in the electrostatic inkjet method may also be controlled to smaller sizes, preferably to sizes of not more than 1 micrometer and then patterned.

The liquid droplets flowing inside the channel 122 of the guide channel unit 120 together with gas are discharged outside the guide channel unit 120, wherein by the configuration of the aforementioned virtual impactor 180, the gas is either naturally discharged through the portion spaced apart between the guide channel unit 120 and the nozzle tube 172 of the nozzle unit 170, or discharged outside by the suction force of the gas suction device 190, while the liquid droplets are introduced into the colinearly arranged nozzle tube 172 of the nozzle unit 170 by inertia. Therefore, the liquid droplets introduced into the nozzle tube 172 are discharged towards the substrate via the nozzle tube 172.

Here, as illustrated in FIGS. 5 and 6, an inner wall of the channel 122 or an inner wall of the nozzle tube 172 are made to form an aerodynamic lens such that the size of the diameter of the inner wall decreases in phases along the motion direction of the liquid droplets, thereby focusing and guiding the liquid droplets to the center as they flow along the channel 122 or the nozzle tube 172.

FIG. 7 illustrates an enlarged photograph of a pattern formed by the liquid droplets discharged by an ink jetting apparatus 100 prepared according to the present disclosure, showing that it is possible to pattern fine line widths of the size of 1 micrometer with stability.

Hereinbelow, a printing system according to an embodiment of the present disclosure will be described with reference to FIG. 8.

Figure 8:
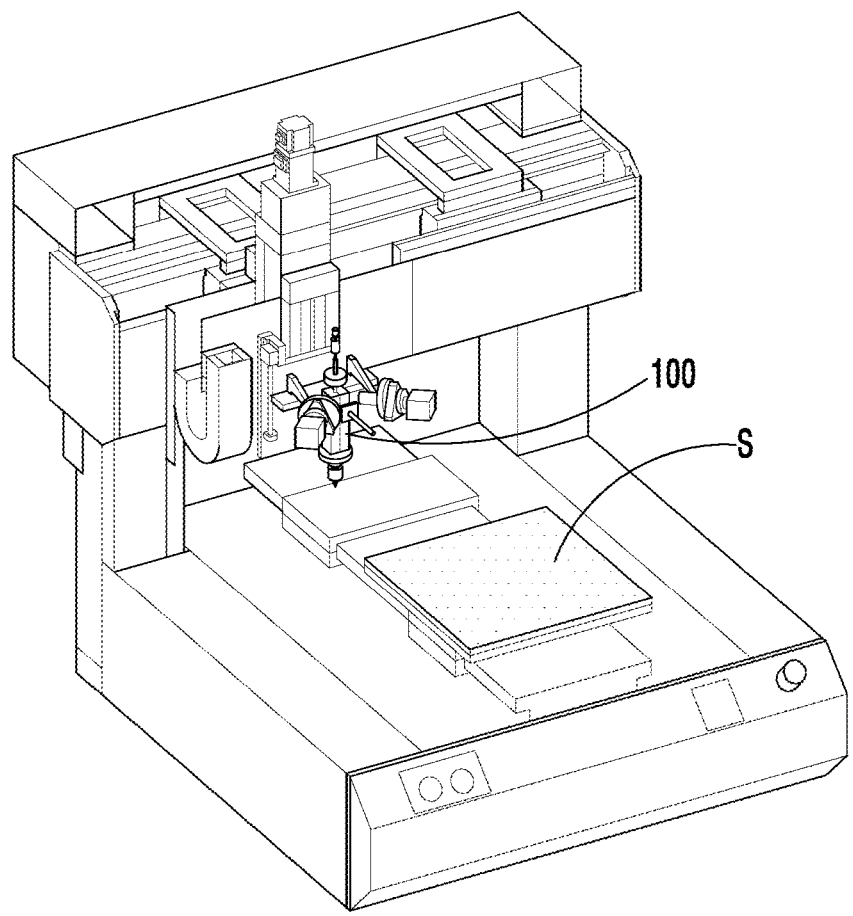
FIG. 8 is a perspective view illustrating a printing system according to an embodiment of the present disclosure.

FIG. 8 is a perspective view illustrating a printing system according to an embodiment of the present disclosure.

The printing system 200 according to an embodiment of the present disclosure may be configured to include an ink jetting apparatus 100, a substrate station 210 and a transfer unit.

The ink jetting apparatus 100 may be the ink jetting apparatus 100 described above with reference to FIGS. 1 to 7, but detailed description on the ink jetting apparatus 100 will be omitted. Here, in FIG. 8, a single ink jetting apparatus 100 is installed, but a plurality of ink jetting apparatuses 100 may be provided and controlled simultaneously to perform patterning on the substrate.

The substrate station 210 mounts the substrate S to be hit by the liquid droplets being discharged from the ink jetting apparatus 100 positioned on an upper portion.

The transfer unit moves the ink jetting apparatus 100 or the substrate station 210 to control the position where the liquid droplets being discharged from the ink jetting apparatus 100 hit the substrate S. In the drawings, it is illustrated that the transfer unit moves the substrate station 210 front and back, and the ink jetting apparatus 100 left and right and up and down, thereby controlling the three-dimensional xyz position between the substrate S and the ink jetting apparatus 100, but there is no limitation thereto, and thus the transfer unit may be configured such that the position of the substrate station 210 is fixated and the position of the ink jetting apparatus 100 may be controlled around the three xyz axes. Various well-known methods may be used for the configuration of the transfer unit, and thus detailed description thereof will be omitted.

Therefore, the position where the liquid droplets hit the substrate may be controlled by the transfer unit, and a three-dimensional shape patterning of dots, lines and surfaces may be performed.

In the drawings and specification, there have been disclosed typical embodiments of the invention, and although specific terms are employed, they are used in a generic and descriptive sense only and not for purposes of limitation. It will be understood by those of ordinary skill in the art that various changes in form and details may be made therein without departing from the spirit and scope of the present invention as defined by the following claims.

REFERENCE NUMERALS

100: INK JETTING APPARATUS
110: LIQUID DROPLET GENERATING UNIT
110a: INKJET HEAD OF PIEZOELECTRIC INKJET METHOD
110b: INKJET HEAD OF ELECTROSTATIC INKJET METHOD
112: NOZZLE
114: PIEZOELECTRIC ELEMENT
116a, 116b: ELECTRODES
120: GUIDE CHANNEL UNIT
122: CHANNEL
130: GAS SUPPLY UNIT
140: ELECTRIC CHARGE QUANTITY CONTROL UNIT
150: HEATING UNIT
170: NOZZLE UNIT
172: NOZZLE TUBE
180: VIRTUAL IMPACTOR
190: GAS SUCTION DEVICE
200: PRINTING SYSTEM
210: SUBSTRATE STATION
S: SUBSTRATE

What is claimed is:

1. An ink jetting apparatus comprising:
a liquid droplet generating unit configured to generate liquid droplets and jet the generated liquid droplets;
a guide channel unit having a channel extending from the liquid droplet generating unit towards a nozzle unit in a direction that the liquid droplets are jetted to guide the jetted liquid droplets, said channel having a length long enough to allow evaporation of a solvent from the liquid droplets during a flow of the liquid droplets in the channel to form micro-fine liquid droplets, and being configured to protect the liquid droplets from thermal and physical disturbance; and
the nozzle unit configured to discharge the micro-fine liquid droplets that passed through the guide channel unit towards a substrate,
wherein the liquid droplet generating unit is formed as an inkjet head configured to discharge the liquid droplets in drop-on-demand method.

2. The ink jetting apparatus according to claim 1,
wherein the liquid droplet generating unit is formed as an inkjet head of piezoelectric inkjet method or an inkjet head of electrostatic inkjet method.

3. The ink jetting apparatus according to claim 1,
wherein the guide channel unit is made of metal and is applied with voltage in order to focus the liquid droplets having electric charges to a center of the guide channel unit.

4. The ink jetting apparatus according to claim 1,
further comprising a gas supply unit configured to supply gas to an inside of a channel of the guide channel unit along a moving direction of the liquid droplets.

5. The ink jetting apparatus according to claim 4,
wherein Reynolds Number is not more than 2,300 such that flow of the gas in the nozzle unit is laminar flow.

6. The ink jetting apparatus according to claim 4,
wherein one end of the guide channel unit where the liquid droplets are discharged and a nozzle tube in the nozzle unit through which the liquid droplets pass are spaced apart from each other,
further comprising a virtual impactor configured to inhale some of the gas being jetted from the guide channel unit through the spaced apart portion.

7. The ink jetting apparatus according to claim 4,
wherein the gas comprises at least one of a gas kind comprising at least one of air, nitrogen and argon; a gas vaporized from water or from a solvent included the liquid droplets; and a mixed gas of the gas kind and the vaporized gas.

8. The ink jetting apparatus according to claim 1,
further comprising a heating unit configured to heat an outer circumference of the guide channel unit.

9. The ink jetting apparatus according to claim 8, wherein the heating unit is heat-shielded to prevent heat generated in the heating unit from being transferred to places other than the guide channel unit.

10. The ink jetting apparatus according to claim 1,
wherein the channel of the guide channel unit is formed such that a tube diameter of the channel decreases in phases along a moving direction of the liquid droplets.

11. The ink jetting apparatus according to claim 1,
wherein a nozzle tube inside the nozzle unit through which the liquid droplets pass is formed such that a tube diameter of a channel decreases in phases along a moving direction of the liquid droplets.

12. The ink jetting apparatus according to claim 1,
further comprising an electric charge quantity control unit formed in the guide channel unit to control an electric charge quantity of the liquid droplets that pass through a channel of the guide channel unit.

13. A printing system comprising:
an ink jetting apparatus comprising a liquid droplet generating unit configured to generate liquid droplets and jet the generated liquid droplets;
a guide channel unit having a channel extending from the liquid droplet generating unit towards a nozzle unit in a direction that the liquid droplets are jetted to guide the jetted liquid droplets, said channel having a length long enough to allow evaporation of a solvent from the liquid droplets during a flow of the liquid droplets in the channel to form micro-fine liquid droplets and protect the liquid droplets from thermal and physical disturbance; and
the nozzle unit configured to discharge the micro-fine liquid droplets that passed through the guide channel unit towards a substrate;
wherein the liquid droplet generating unit is formed as an inject head configured to discharge the liquid droplets in drop-on-demand method;
a substrate station configured to mount the substrate to be hit by the micro-fine liquid droplets being discharged from the ink jetting apparatus; and
a transfer unit configured to move the ink jetting apparatus or the substrate station to control a position on the substrate to be hit by the micro-fine liquid droplets.

14. The printing system according to claim 13,
wherein the liquid droplet generating unit is formed as an inkjet head of piezoelectric inkjet method or an inkjet head of electrostatic inkjet method.

15. A printing system comprising:
a plurality of ink jetting apparatuses comprising a liquid droplet generating unit configured to generate liquid droplets and jet the generated liquid droplets;
a guide channel unit having a channel extending from the liquid droplet generating unit towards a nozzle unit in a direction that the liquid droplets are jetted to guide the jetted liquid droplets said channel having a length long enough to allow evaporation of a solvent from the liquid droplets during a flow of the liquid droplets in the channel to form micro-fine liquid droplets, and protect the liquid droplets from thermal and physical disturbance;
and the nozzle unit configured to discharge the micro-fine liquid droplets that passed through the guide channel unit towards a substrate;
wherein the liquid droplet generating unit is formed as an inkjet head configured to discharge the liquid droplets in drop-on demand method;
a substrate station configured to mount the substrate to be hit by the micro-fine liquid droplets being discharged from the ink jetting apparatus; and
a transfer unit configured to move the ink jetting apparatus or the substrate station to control a position on the substrate to be hit by the liquid droplets.

16. The printing system according to claim 15,
wherein the liquid droplet generating unit is formed as an inkjet head of piezoelectric inkjet method or an inkjet head of electrostatic inkjet method.

* * * * *